(12) United States Patent
Park et al.

(10) Patent No.: US 6,342,441 B1
(45) Date of Patent: *Jan. 29, 2002

(54) METHOD FOR FABRICATING SEMICONDUCTOR DEVICE

(75) Inventors: Ji Soo Park; Dong Kyun Son, both of Cheongju (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/434,520

(22) Filed: Nov. 5, 1999

(30) Foreign Application Priority Data

Apr. 2, 1999 (KR) .............................. 99/11590

(51) Int. Cl.$^7$ .............................. H01L 21/22
(52) U.S. Cl. ................ 438/558; 438/232; 438/307; 438/651
(58) Field of Search .............. 438/558, 232, 438/307, 649, 651, 683, 199, 230, 217

(56) References Cited

U.S. PATENT DOCUMENTS

| | | | | |
|---|---|---|---|---|
| 3,812,519 A | * | 5/1974 | Nakamura et al. | 317/234 R |
| 3,887,993 A | * | 6/1975 | Okada et al. | 29/571 |
| 4,558,507 A | * | 12/1985 | Okabayashi et al. | 29/571 |
| 4,692,348 A | * | 9/1987 | Rubloff et al. | 437/82 |
| 5,316,977 A | * | 5/1994 | Kunishima et al. | 437/200 |
| 5,416,037 A | | 5/1995 | Sato et al. | |
| 5,470,791 A | * | 11/1995 | Suguro et al. | 437/192 |
| 5,496,750 A | * | 3/1996 | Moslehi | 437/41 |
| 5,624,869 A | * | 4/1997 | Agnello et al. | 438/602 |
| 5,677,213 A | * | 10/1997 | Lee | 437/41 |
| 5,956,584 A | * | 9/1999 | Wu | 438/232 |
| 5,960,270 A | * | 9/1999 | Misra et al. | 438/197 |
| 5,973,363 A | * | 10/1999 | Staab et al. | 257/347 |
| 5,973,382 A | * | 10/1999 | Burgener et al. | 257/532 |
| 6,005,296 A | * | 12/1999 | Chan | 257/904 |

FOREIGN PATENT DOCUMENTS

| | | | | | |
|---|---|---|---|---|---|
| JP | | 05198528 A | * | 8/1993 | H01L/21/28 |
| JP | | 08031949 A | * | 2/1996 | H01L/21/28 |

* cited by examiner

*Primary Examiner*—Matthew Smith
*Assistant Examiner*—Renzo N. Rocchegiani
(74) *Attorney, Agent, or Firm*—Fleshner & Kim, LLP

(57) ABSTRACT

A method for fabricating a semiconductor substrate includes forming a silicide layer at a predetermined portion of a semiconductor substrate, implanting two or more impurity ions before annealing, and forming an impurity region in the semiconductor substrate by annealing the silicide layer and by diffusing the impurity ions from the silicide layer into the semiconductor substrate. Accordingly, the present invention can improve reliability and performance of a semiconductor device by reducing dopant loss and leakage current of a PN junction in the substrate and by decreasing a sheet resistance of the silicide layer. The dose of the second implanter ions is about one hundred to one thousand times less than the dose of the first implanted ions.

21 Claims, 5 Drawing Sheets

METHOD FOR FABRICATING SEMICONDUCTOR DEVICE

BACKGROUND OF THE INVENTION

1. Field of the Invention

The present invention relates to a method for fabricating a semiconductor device which can improve a property of a PN junction formed in a semiconductor substrate by using a silicide as a dopant source.

2. Background of the Related Art

As a junction depth is decreased, undesirable resistances, such as parasitic, shallow depth, or sheet resistances, and contact resistances of source/drain regions are increased more than a channel resistance, which prevents semiconductor devices from being normally operated. A doped polysilicon, tungsten-silicide, polycide or the like are generally used as a material of a gate electrode.

Resistances of very large scale integrated circuits (VLSI) should be minimized, which has been attempted using self-aligned silicide (SALICIDE). However, in a related method of forming the salicide after forming a PN junction, silicon in the junction is consumed when the salicide is formed. As a result, current leakage is high, limiting the effectiveness of the fabrication of a shallow junction.

A well-known junction formation technique which can compensate for the disadvantage of the related salicide formation technique is to use a silicide dopant source (SADS) process disclosed in R. Liu et al., J. Appl. Phys. vol. 63, p. 1990 (1988), the disclosure of which is incorporated herein by reference in its entirety. According to the SADS process, silicide is formed by the salicide process before forming the PN junction. Thereafter, ions are implanted into the silicide, and a thermal process is carried out thereon. A dopant is driven in the silicon at a lower portion from the silicide, thereby forming the junction.

According to the SADS process, damage resulting from the ion implantation occurs merely in the silicide, and does not influence a silicon substrate, but provides a superior junction property. In addition, the silicide junction is formed as rough as a silicide/silicon interface, and thus the silicide passing through the junction does not generate leakage. Furthermore, a dopant concentration at the highly-doped region of the junction is not reduced by the silicide as in the related method, and the dopant concentration at the silicide/silicon interface is maintained, resulting in an improved contact resistance.

In R. Lippens et al., J. Physique C 4, 191 (1988), the disclosure of which is incorporated herein by reference in its entirety, the method of using the silicide as a dopant diffusion source is described for a gate doping of a polysilicon and a junction formation. The Lippens article discloses that it is much easier to perform the gate doping of the polysilicon in a polycide structure by using the silicide as a dopant diffusion source.

It is also described in L. van den Hove et al., Appl. Surf. Sci., vol.38, p.430 (1989), the disclosure of which is incorporated herein by reference in its entirety, that the silicide to which the SADS process can be applied has good reactivity with the dopant, and thus $CoSi_2$ is preferable to $TiSi_2$.

FIGS. 1A to 1D are process views illustrating sequential steps of a related method of fabricating a semiconductor device. As shown in FIG. 1A, a field oxide film 2 is formed at a device isolation region F1 of a P-type semiconductor substrate 1 by a local oxidation of silicon (LOCOS) process. A gate insulation film 3 is formed at a device formation region Al of the substrate 1 by performing a thermal oxidation process on the surface of the substrate 1. A gate electrode 4 is formed on the gate insulation film 3 by depositing the polysilicon by a chemical vapor deposition (CVD) process and patterning the deposited polysilicon layer.

As shown in FIG. 1B, sidewall spacers 5 having oxide or nitride are formed at each side wall of the gate electrode 4 and the gate insulation film 3. A cobalt silicide layer ($CoSi_2$) 6 having a thickness of approximately 350 Å is formed on the gate electrode 4 and on the substrate 1 adjacent to both the field oxide film 2 and the side portions of the sidewall spacers 5. The cobalt silicide layer 6 is formed by depositing a cobalt (Co) layer at an entire surface of the substrate 1, by performing an annealing process thereon, and by selectively removing the cobalt layer formed on the sidewall spacers 5 and the field oxide film 2. As illustrated in FIG. 1C, arsenic (As), which is an N-type impurity, is ion-implanted into the cobalt silicide layer 6 with a dose of $1.0 \times 10^{16}$ ions/cm$^2$ and an ion implantation energy of 30 KeV.

Referring to FIG. 1D, after the arsenic is implanted, an annealing process is carried out to diffuse the arsenic ions implanted into the cobalt silicide layer 6. As a result, an N-type impurity region 7 is formed on the substrate 1, and arsenic ions are doped on the gate electrode 4. The annealing process is performed at a temperature between 800° C. and 1000° C. to form a PN junction between the substrate 1 and the impurity region 7.

FIG. 2 shows an analysis of an arsenic concentration distribution at the PN junction formed in the substrate 1 by using a secondary ion mass spectrometry (SIMS). As shown in FIG. 2, the higher the annealing temperature, the more the arsenic concentration is reduced.

According to the related method for fabricating the semiconductor device, the dopant is ion-implanted into the cobalt silicide layer. However, a considerable amount of the dopant escapes during the annealing process. Consequently, the PN junction is deteriorated, or a dopant shortage phenomenon occurs in the polysilicon gate electrode.

The above references are incorporated by reference herein where appropriate for appropriate teachings of additional or alternative details, features and/or technical background.

SUMMARY OF THE INVENTION

It is an object of the present invention to provide a method for fabricating a semiconductor device which can improve a PN junction property. The preferred embodiments provide the benefit of preventing a dopant implanted into a cobalt silicide layer from escaping during an annealing process.

The object of the invention can be achieved in a whole or in part by a method for fabricating a semiconductor device including: forming a silicide layer at a predetermined portion of a semiconductor substrate; implanting first impurity ions into the silicide layer; implanting second impurity ions into the silicide layer; and annealing the silicide layer to diffuse the first and second impurity ions from the silicide layer to the substrate.

The object of the invention can also be achieved in a whole or in part by a method for fabricating a semiconductor device including: forming a gate insulation film at a predetermined portion over a semiconductor substrate; forming a gate electrode over the gate insulation film; forming sidewall spacers at first and second side walls of the gate electrode and the gate insulation film; forming a silicide layer over the semiconductor substrate adjacent to the sidewall spacers; implanting first impurity ions into the silicide layer; implanting second impurity ions into the silicide layer; and annealing the silicide layer to diffuse the first and second impurity ions from the silicide layer to the substrate.

The first and second implantation processes are performed by implanting one of arsenic (AS), phosphorous (P), boron fluoride ($BF_2$), boron (B), silicon (Si) and argon (Ar) into the silicide layer. However, a dose of the impurity ions implanted into the silicide layer during the second implantation process is set lower than a dose of the impurity ions implanted during the first implantation process by a ratio of about 1/100 to 1/1000.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1A:
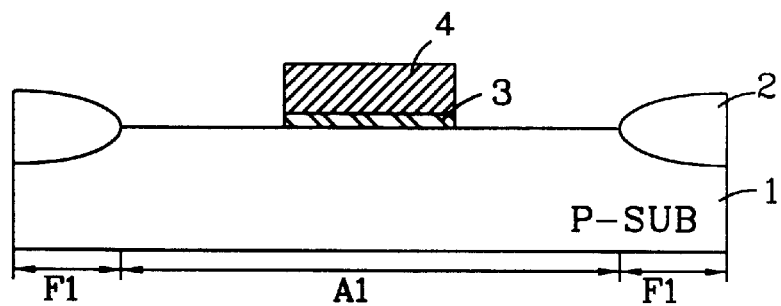
FIGS. 1A, 1B, 1C and 1D are process views illustrating sequential steps of a related method for fabricating a semiconductor device.
Figure 1B:
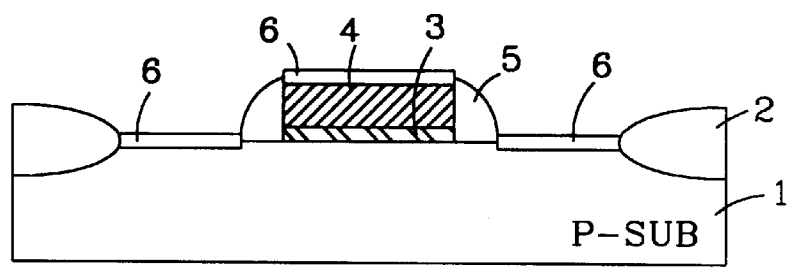
Figure 1C:
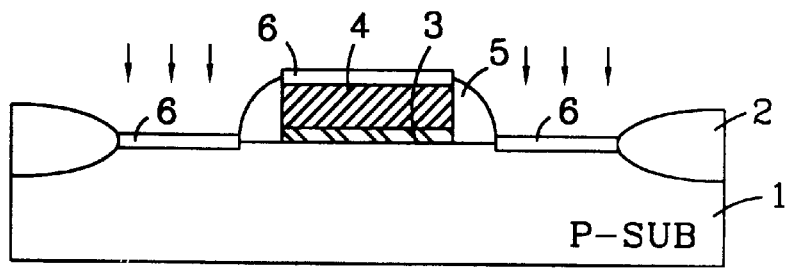
Figure 1D:
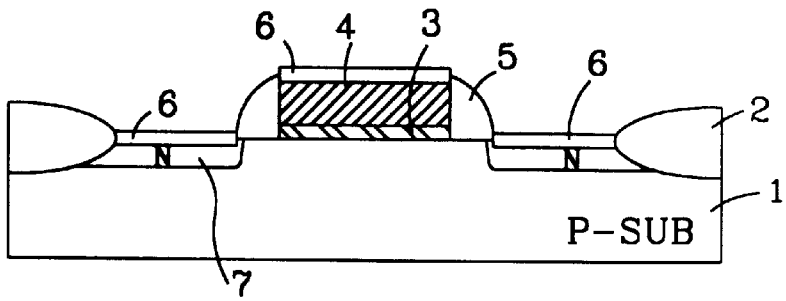
Figure 2:
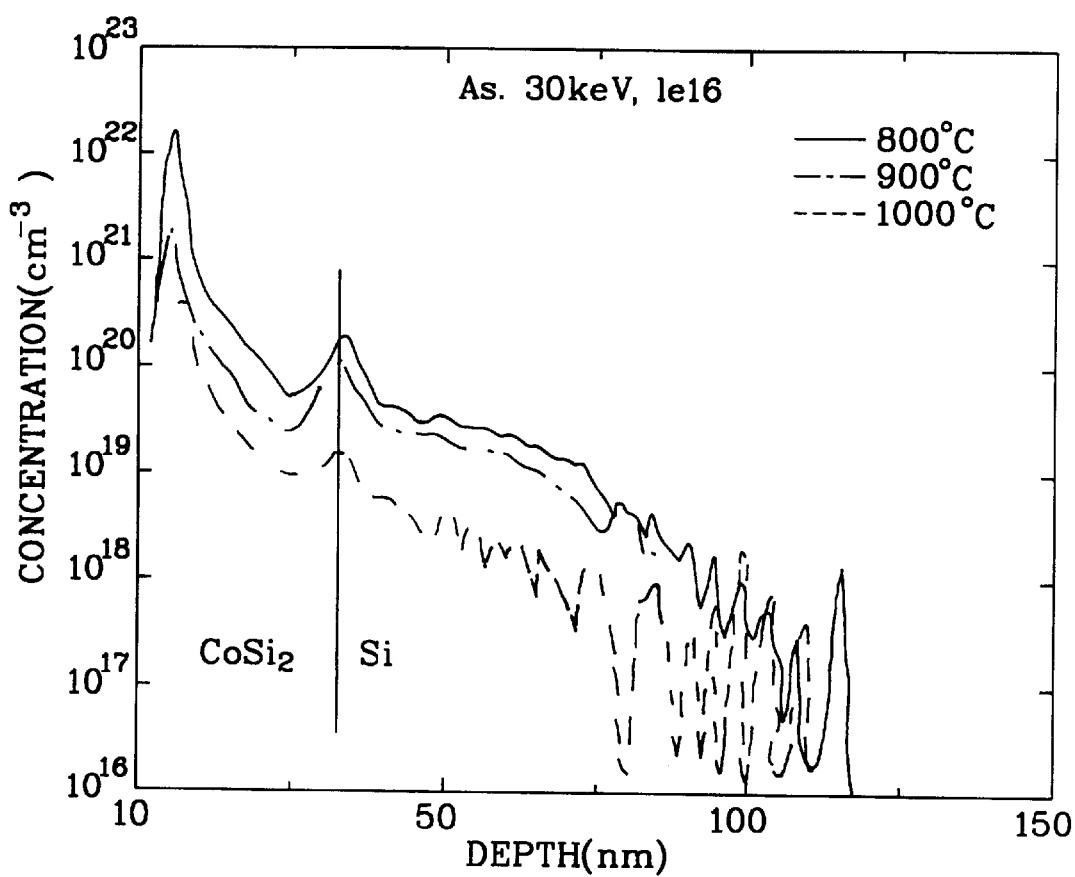
FIG. 2 is a graph showing an arsenic concentration distribution of a PN junction formed in a semiconductor substrate after the annealing process of FIG. 1D.
Figure 3A:
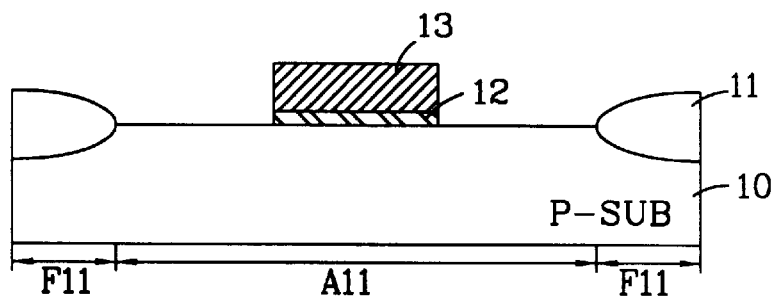
FIGS. 3A, 3B, 3C, 3D and 3E are process views illustrating sequential steps of a method for fabricating a semiconductor device in accordance with a preferred embodiment of the present invention.

FIGS. 3A to 3E are process views illustrating sequential steps of a method for fabricating a semiconductor device in accordance with a preferred embodiment of the present invention. As shown in FIG. 3A, a field oxide film 11 is formed at a device isolation region F11 on a P-type semiconductor substrate 10 by a local oxidation of silicon (LOCOS) process. A gate insulation film 12 is formed at a device formation region A11 of the substrate 10, and a gate electrode 13 is formed on the gate insulation film 12. The gate insulation film 12 is formed by oxidizing the surface of the semiconductor substrate 10 by a thermal oxidation process. The gate electrode 13 is formed by depositing a layer of polysilicon by a chemical vapor deposition (CVD) process, and by patterning the deposited polysilicon layer.

Figure 3B:
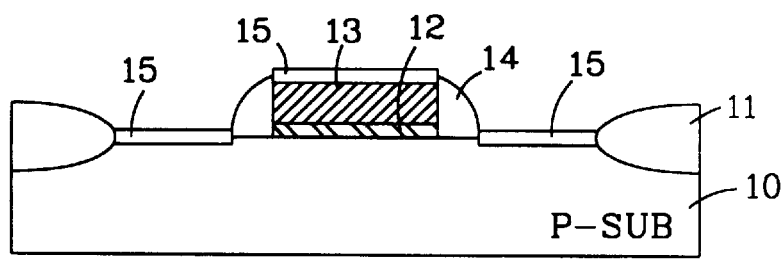

As shown in FIG. 3B, sidewall spacers 14 having oxide or nitride are formed at each side wall of the gate electrode 13 and gate insulation film 12. A cobalt silicide layer ($CoSi_2$) 15 having a thickness of approximately 350 Å is formed on the substrate 10 adjacent to the field oxide film 11 and both sides of the sidewall spacers 14, and is also formed on the gate electrode 13. The cobalt silicide layer 15 is formed by depositing cobalt (Co) at the entire surface of the substrate 10, carrying out the annealing process thereon, and selectively removing the cobalt layer formed at the sidewall spacers 14 and the field oxide film 11. The silicide layer 15 may also be formed by depositing at least one of titanium (Ti), nickel (Ni), palladium (Pd), platinum (Pt), chromium (Cr), molybdenum (Mo), tantalum (Ta) and tungsten (W).

Figure 3C:
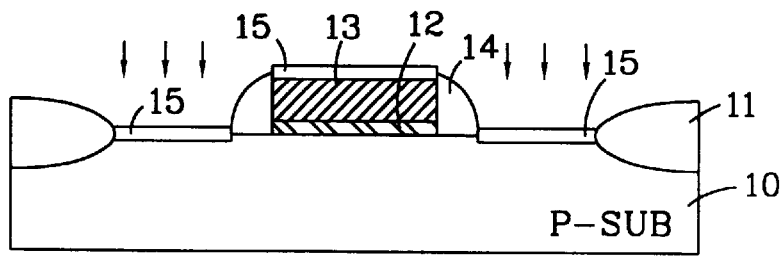

In this example of the preferred embodiment, as shown in FIG. 3C, an N-type impurity such as arsenic (As) is implanted into the cobalt silicide layer 15 as the first implantation. Arsenic is implanted into the cobalt silicide layer 15 having a dose of $1.0 \times 10^{16}$ ions/$cm^2$ and an ion implantation energy of 30 KeV. Here, N-type impurities, such as boron fluoride ($BF_2$), boron (B), phosphorous (P) argon (Ar) or silicon (Si), may be employed instead of arsenic (As).

Figure 3D:
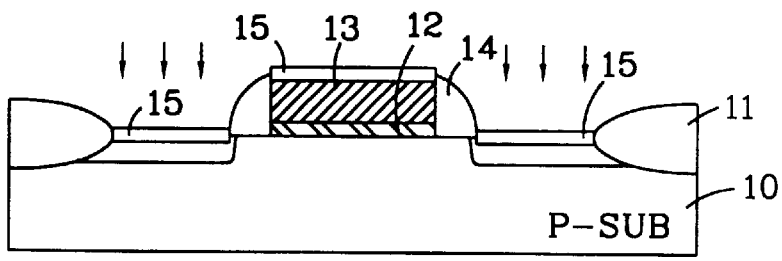

Referring to FIG. 3D, after the first implantation, an N-type impurity, here phosphorous (P), for example, is subsequently implanted into the cobalt silicide layer 15 as the second implantation. Phosphorous (P) is implanted at a lower dose than arsenic (As) by a ratio of about 1/100 to 1/1000, and at an ion implantation energy of about 20 KeV. In this subsequent implantation, silicon (Si), argon (Ar), arsenic (As), boron fluoride ($BF_2$), or boron (B) may be used instead of phosphorous (P).

Figure 3E:
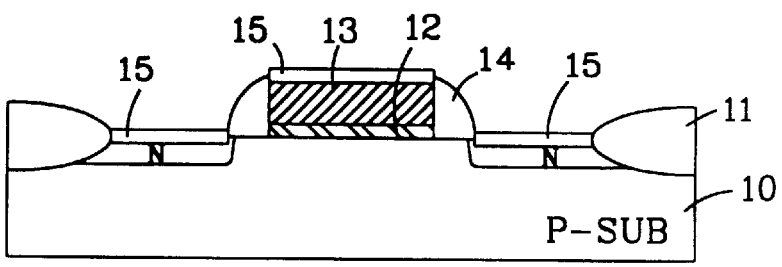

As shown in FIG. 3E, after the first and second implantations, the annealing process is carried out to diffuse the first and second impurities, for example As and P ions, implanted into the cobalt silicide layer 15. As a result, an N-type impurity region 16 is formed on the substrate 10 by diffusion of the first and second impurities, which are also doped at the gate electrode 13. Accordingly, a PN junction is formed between the P-type substrate 10 and the N-type impurity region 16.

The annealing process is performed at a temperature of about 900° C. for about 30 seconds. During the annealing process, lateral diffusion of the impurity ions to a channel region is very small.

Figure 4:
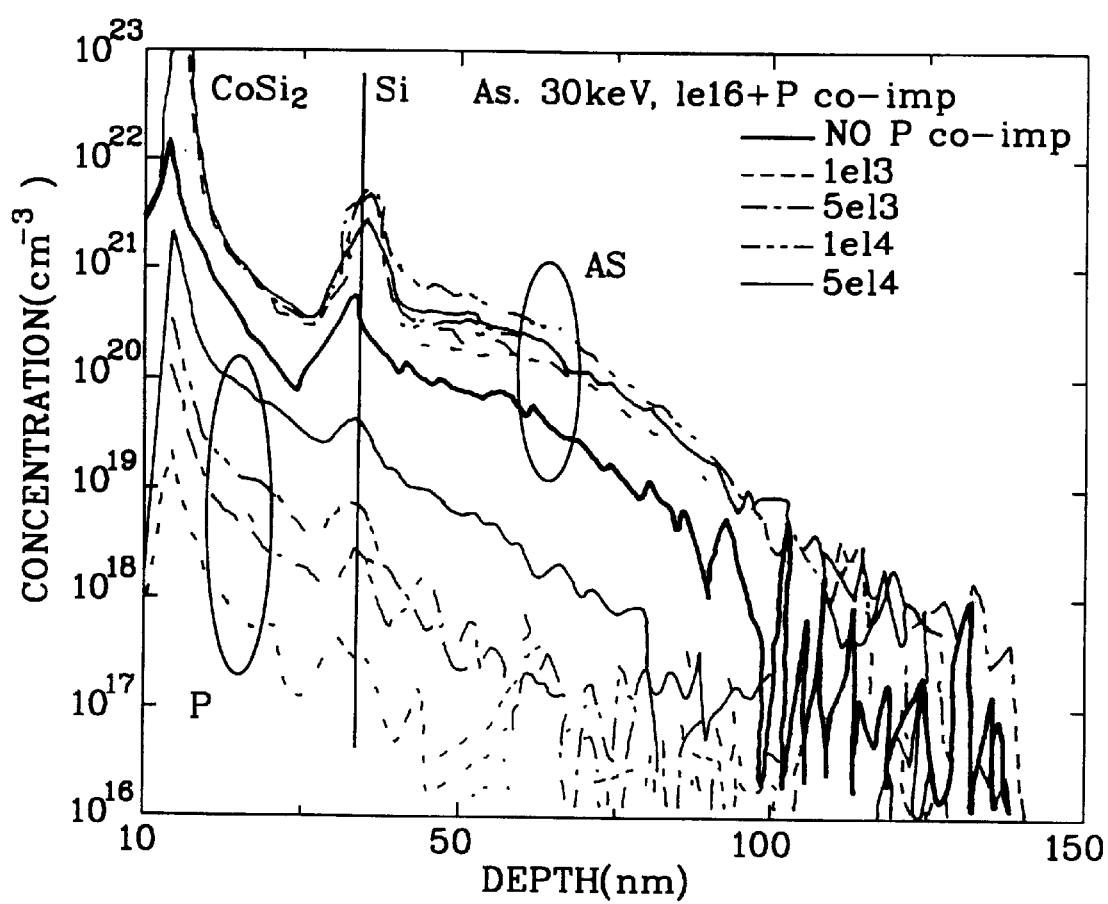
FIG. 4 is a graph showing AS and P concentration distributions of a PN junction formed in a semiconductor substrate after an annealing process of FIG. 3E.

FIG. 4 is a graph showing an analysis of As and P concentration distributions of the PN junction formed in the semiconductor substrate as illustrated in FIG. 3E using a secondary ion mass spectrometry (SISM). That is, as shown in FIG. 3C, arsenic is implanted on the cobalt silicide $CoSi_2$ layer 15, which has a thickness of 350 Å and is formed over the silicon substrate 10. The arsenic (As) is implanted having a dose of $1.0 \times 10^{16}$ ions/$cm^2$ and an ion implantation energy of 30 KeV. Four different devices were prepared using different P ion concentrations. The P was implanted in the $CoSi_2$ layer 15 at doses of $1.0 \times 10^{13}$ ions/$cm^2$, $5.0 \times 10^{13}$ ions/$cm^2$, $1.0 \times 10^{14}$ ions/$cm^2$ and $5.0 \times 10^{14}$ ions/$cm^2$, and with an ion implantation energy of 20 KeV.

The resulting samples were annealed at a temperature of about 900° C. for about 30 seconds, and the implanted ions were diffused toward the silicon substrate. Thereafter, the ion distribution was analyzed based on the depth of the sample by using the SISM.

As shown in FIG. 4, the concentration of the arsenic (As) is increased when phosphorus (P) is ion-implanted having a lower dose than arsenic (As) by about 1/100 to 1/1000. That is, the implanted P ions do not deepen the junction, but prevent loss of As from the junction, resulting in the formation of a stabilized junction, thus providing unexpectedly better results than the related art. As shown in FIG. 4, a loss of As is prevented when a dose of P is more than $1.0 \times 10^{14}$ ions/$cm^2$.

Figure 5:
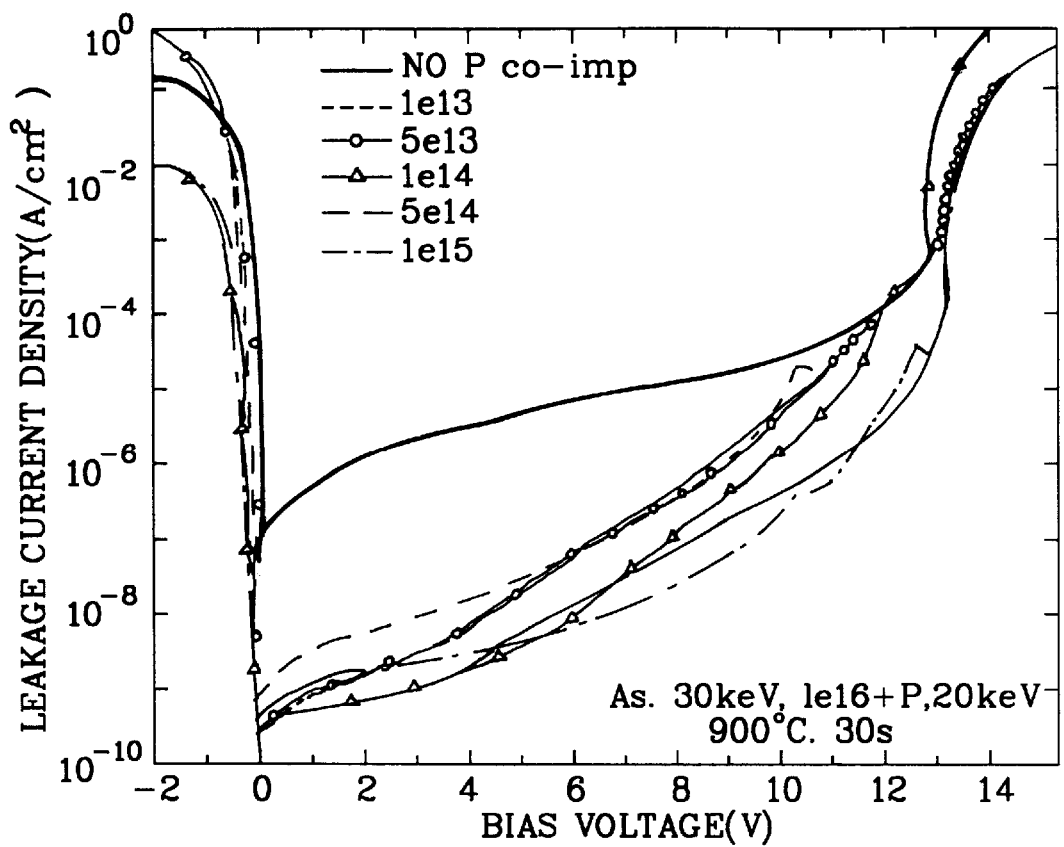
FIG. 5 is a graph showing a leakage current property of the PN junction formed in the substrate after the annealing process of FIG. 3E.

FIG. 5 is a graph showing a leakage current property of an NP junction based on the results shown in FIG. 4. As shown in FIG. 5, when phosphorus (P) is ion-implanted, a leakage current is at least two orders of magnitude less than when P is not ion-implanted. A lower dose of phosphorous (P) prevents a loss of As, thereby forming a stable junction. Accordingly, the afore-mentioned leakage current reduction is achieved because As ions do not move to the substrate during and after the annealing process, thus providing unexpectedly better results than the related art previously discussed.

As discussed earlier, the method for fabricating the semiconductor device in accordance with the present invention prevents the dopant implanted into the cobalt silicide layer from moving out during the annealing process, thereby forming the stable PN junction and improving the device property.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a semiconductor device, comprising:
   (a) forming a silicide layer at a predetermined portion over a semiconductor substrate;
   (b) implanting first impurity ions into the silicide layer;
   (c) implanting second impurity ions into the silicide layer for preventing first impurity ion out diffusion; and
   (d) annealing the silicide layer to diffuse the first and second impurity ions from the silicide layer to the substrate.

2. The method of claim 1, wherein step (c) implants the second impurity ions at a dose about 1/100 to 1/1000 lower than a dose of the first impurity ions implanted at step (b).

3. The method of claim 2, wherein the second impurity ions have an ion implantation energy of about 20 KeV.

4. The method of claim 1, further comprising:
   forming a field oxide film at a device isolation region over the semiconductor substrate,
   forming a gate insulation film at a device formation region over the semiconductor substrate,
   forming a gate electrode over the gate insulation film,
   forming sidewall spacers at first and second side walls of the gate electrode and gate insulation film, and
   forming the silicide layer between the field oxide film and the sidewall spacers.

5. The method of claim 4, wherein the sidewall spacers include one of an oxide and a nitride.

6. The method of claim 4, wherein step (a) comprises:
   forming a metal layer at the upper portions of the semiconductor substrate, the field oxide film, the gate electrode and the sidewall spacers; and
   annealing the metal layer.

7. The method of claim 6, further comprising:
   partially removing the metal layer formed on the field oxide film and the sidewall spacers.

8. The method of claim 6, wherein step (d) is carried out at a temperature between about 650° C. and 750° C.

9. The method of claim 6, wherein the metal layer comprises at least one material selected from the group consisting of titanium, cobalt, nickel, palladium, platinum, chromium, molybdenum, tantalum, and tungsten.

10. The method of claim 1, wherein step (a) includes:
    forming a metal layer at the upper portions of the semiconductor substrate; and
    annealing the metal layer.

11. The method of claim 10, further comprising partially removing portions of the metal layer.

12. The method of claim 1, wherein step (b) implants one of arsenic, phosphorus, boron fluoride, boron, silicon, and argon as the first impurity ions.

13. The method of claim 12, wherein step (b) implants arsenic (As) having a dose of about $1.0 \times 10^{16}$ ions/cm$^2$ and an ion implantation energy of about 16 to 32 KeV.

14. The method of claim 1, wherein step (b) implants arsenic (As) having a dose of about $1.0 \times 10^{16}$ ions/cm$^2$ and an ion implantation energy of about 16 to 32 KeV.

15. The method of claim 14, wherein step (c) implants phosphorus having a dose of about $1.0 \times 10^{13}$ ions/cm$^2$ to about $5.0 \times 10^{14}$ ions/cm$^2$ and an ion implantation energy of about 20 KeV.

16. The method of claim 1, wherein step (c) implants one of arsenic, phosphorous, boron fluoride, boron, silicon and argon as the second impurity ions.

17. The method of claim 1, wherein step (c) implants phosphorus having a dose about 1/100 to 1/1000 lower than a dose of the first impurity ions implanted at step (b), the phosphorus having an ion implantation energy of about 20 KeV.

18. The method of claim 1, wherein step (d) anneals the silicide layer at a temperature of about 900° C. for about 30 seconds.

19. A method for fabricating a semiconductor device, comprising:
    (a) forming a gate insulation film at a predetermined portion over a semiconductor substrate;
    (b) forming a gate electrode over the gate insulation film;
    (c) forming sidewall spacers at first and second side walls of the gate electrode and the gate insulation film;
    (d) forming a silicide layer over the semiconductor substrate adjacent to the sidewall spacers;
    (e) implanting first impurity ions into the silicide layer;
    (f) implanting second impurity ions into the silicide layer for preventing first impurity ion out diffusion; and
    (g) annealing the silicide layer to diffuse the first and second impurity ions from the silicide layer to the semiconductor substrate.

20. The method of claim 19, wherein step (d) forms a silicide layer over the semiconductor substrate and over the gate electrode.

21. The method of claim 19, wherein step (f) implants second impurity ions having a dose about one hundred to about one thousand times less than a dose of the first impurity ions.

* * * * *